(12) United States Patent
Byun et al.

(10) Patent No.: US 11,844,240 B2
(45) Date of Patent: Dec. 12, 2023

(54) DISPLAY DEVICE AND METHOD OF MANUFACTURING THE SAME

(71) Applicant: Samsung Display Co., LTD., Yongin-si (KR)

(72) Inventors: Jin-Su Byun, Seoul (KR); Sang Hyun Lee, Hwaseong-si (KR); Sae Hee Han, Seoul (KR); Ji-Hyun Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 200 days.

(21) Appl. No.: 17/073,874

(22) Filed: Oct. 19, 2020

(65) Prior Publication Data

US 2021/0143235 A1    May 13, 2021

(30) Foreign Application Priority Data

Nov. 12, 2019  (KR) .......................... 10-2019-0144264

(51) Int. Cl.
| | | |
|---|---|---|
| H01L 27/32 | (2006.01) | |
| H10K 59/122 | (2023.01) | |
| H10K 50/844 | (2023.01) | |
| H10K 59/40 | (2023.01) | |
| H10K 59/35 | (2023.01) | |
| H10K 71/00 | (2023.01) | |
| H10K 59/12 | (2023.01) | |

(52) U.S. Cl.
CPC ......... *H10K 59/122* (2023.02); *H10K 50/844* (2023.02); *H10K 59/353* (2023.02); *H10K 59/40* (2023.02); *H10K 71/00* (2023.02); *H10K 59/1201* (2023.02)

(58) Field of Classification Search
CPC ............. H01L 27/3246; H01L 27/3218; H01L 27/323; H01L 51/5253; H01L 51/56; H01L 2227/323
USPC .......................................................... 257/40
See application file for complete search history.

(56) References Cited

U.S. PATENT DOCUMENTS

| | | | | |
|---|---|---|---|---|
| 2016/0118628 | A1* | 4/2016 | Kang ................... | H10K 50/858 257/40 |
| 2016/0282987 | A1* | 9/2016 | Choi ..................... | G06F 3/0446 |
| 2017/0141169 | A1* | 5/2017 | Sim ..................... | H01L 27/3258 |
| 2017/0141349 | A1* | 5/2017 | Kwak ................. | H01L 27/3248 |

(Continued)

FOREIGN PATENT DOCUMENTS

| | | |
|---|---|---|
| KR | 10-2017-0050139 | 5/2017 |
| KR | 10-2018-0121750 | 11/2018 |
| KR | 10-2019-0004863 | 1/2019 |

*Primary Examiner* — Dzung Tran
(74) *Attorney, Agent, or Firm* — KILE PARK REED & HOUTTEMAN PLLC

(57) ABSTRACT

A display device includes a base substrate, a pixel defining layer disposed on the base substrate and including a first opening, a light emitting structure disposed in the first opening of the pixel defining layer, a thin film encapsulation layer disposed on the light emitting structure, a touch electrode disposed on the thin film encapsulation layer, an insulating pattern disposed on the touch electrode and including a second opening which overlaps the first opening, and a high refractive layer disposed on the insulating pattern, the high refractive layer including a plurality of grid patterns disposed on a top surface of the high refractive layer, and a refractive index higher than a refractive index of the insulating pattern.

15 Claims, 17 Drawing Sheets

(56) References Cited

U.S. PATENT DOCUMENTS

| | | | | |
|---|---|---|---|---|
| 2018/0123074 A1* | 5/2018 | Lee | ........................ | H01L 27/322 |
| 2018/0246330 A1* | 8/2018 | Fattal | .................... | G02B 6/0058 |
| 2018/0314067 A1* | 11/2018 | Cho | .................... | H01L 51/0096 |
| 2019/0079338 A1* | 3/2019 | Liu | ........................ | G02F 1/0136 |
| 2019/0221779 A1* | 7/2019 | Jang | ...................... | H01L 27/323 |
| 2019/0319076 A1* | 10/2019 | Lee | ..................... | H01L 27/3246 |
| 2021/0294041 A1* | 9/2021 | Kim | ................... | C08G 18/3876 |

* cited by examiner

FIG. 4
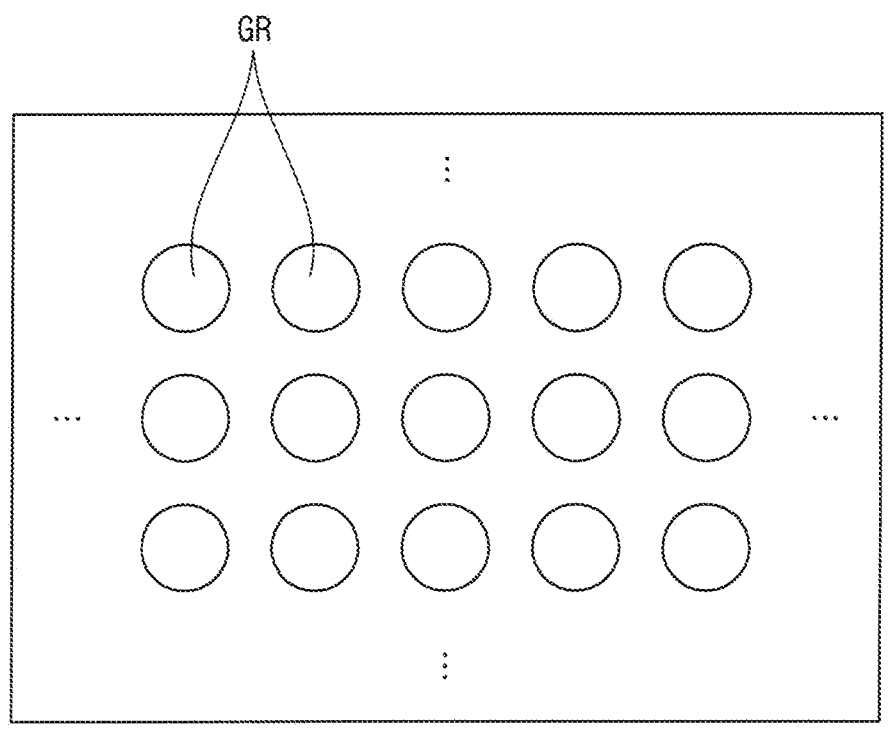
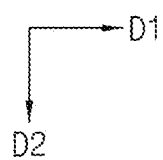

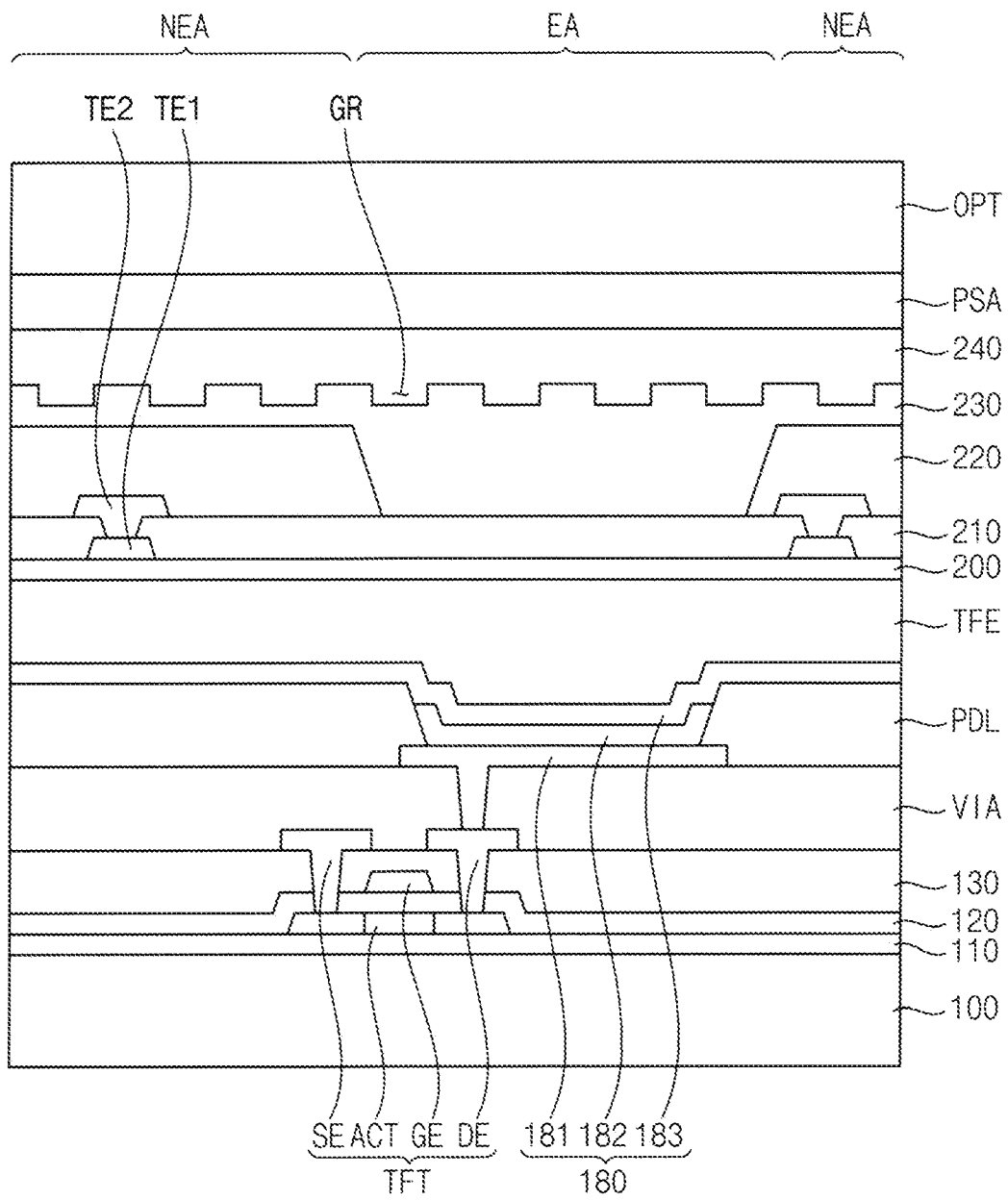

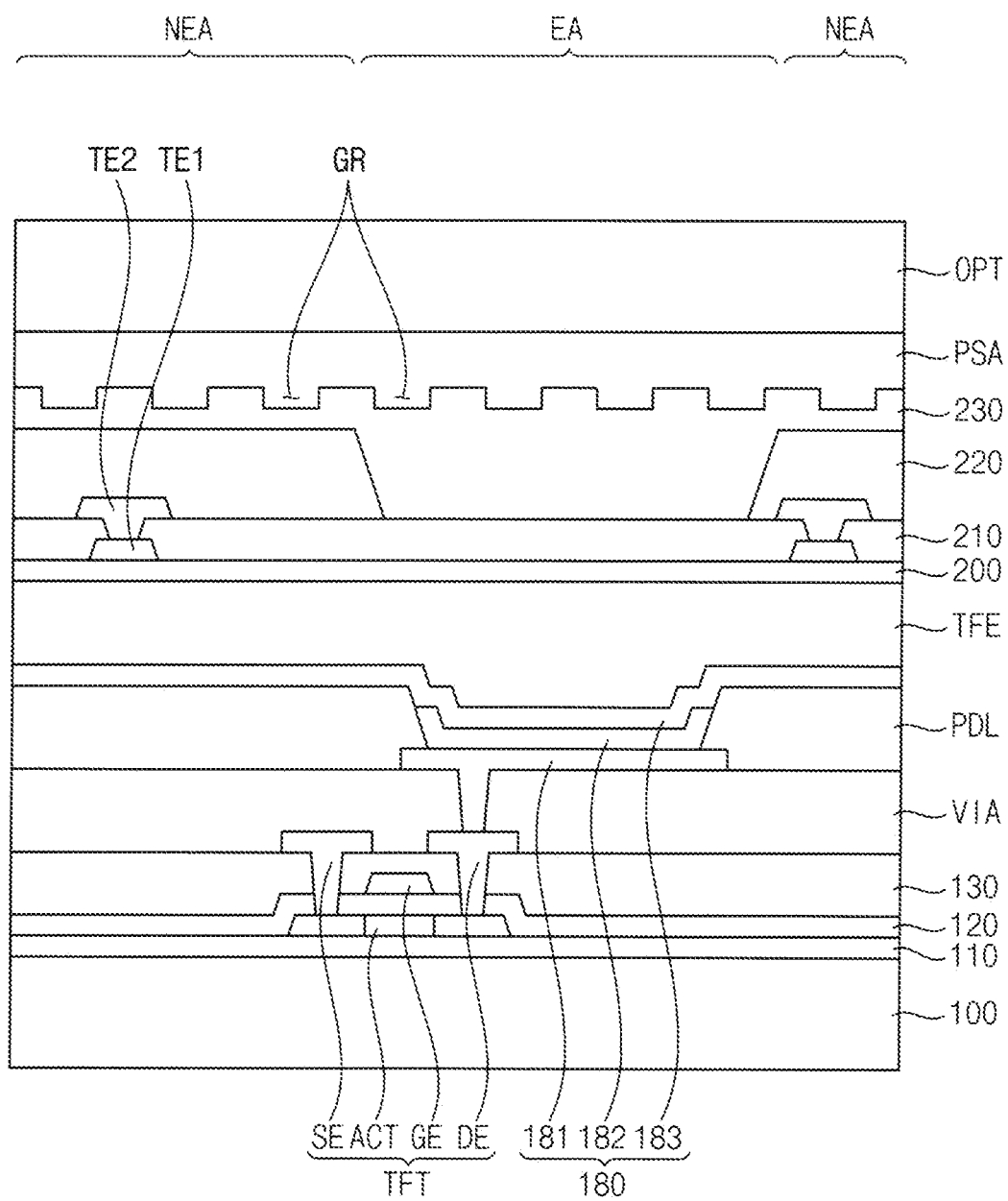

DISPLAY DEVICE AND METHOD OF MANUFACTURING THE SAME

CROSS-REFERENCE TO RELATED APPLICATION(S)

This application claims priority to and benefits of Korean Patent Application No. 10-2019-0144264 under 35 USC § 119, filed on Nov. 12, 2019 in the Korean Intellectual Property Office, the entire contents of which are incorporated herein by reference.

BACKGROUND

1. Technical Field

Embodiments relate to a display device having improved image quality and a method of manufacturing the display device.

2. Description of the Related Art

Recently, as the technology improves, display products having smaller sizes, lighter weights, and superior performance have been produced. Conventional cathode ray tube (CRT) televisions have been widely used for display devices with many advantages in terms of performance and price. However, a display device such as a plasma display device, a liquid crystal display device, and an organic light emitting diode display device overcomes disadvantages of the CRT in terms of miniaturization and portability and has advantages such as miniaturization, light weight, and low power consumption.

A display device includes a layered structure constituting a pixel, in which light characteristics vary according to a design of the layered structure, so that the display quality may be deteriorated.

SUMMARY

Embodiments provide a display device having improved image quality.

Embodiments provide a method of manufacturing the display device.

According to embodiments, a display device may include a base substrate, a pixel defining layer disposed on the base substrate and including a first opening, a light emitting structure disposed in the first opening of the pixel defining layer, a thin film encapsulation layer disposed on the light emitting structure, a touch electrode disposed on the thin film encapsulation layer, an insulating pattern disposed on the touch electrode and including a second opening which overlaps the first opening, and a high refractive layer disposed on the insulating pattern. The high refractive layer may include grid patterns disposed on a top surface of the high refractive layer, and a refractive index higher than a refractive index of the insulating pattern.

In embodiments, the second opening may be larger than the first opening.

In embodiments, the grid patterns may be disposed on the top surface of the high refractive layer in a first direction at a constant interval and in a second direction perpendicular to the first direction at the constant interval.

In embodiments, the grid patterns may each be a circular recess or a circular protrusion.

In embodiments, the first opening may include a first opening of a first sub-pixel, a first opening of a second sub-pixel, and a first opening of a third sub-pixel, which may each have mutually different sizes and shapes. The grid patterns may overlap the first opening of the first sub-pixel, the first opening of the second sub-pixel, and the first opening of the third sub-pixel.

In embodiments, the grid patterns may be exclusively disposed in a portion which does not overlap the second opening.

In embodiments, the grid patterns may have a concave shape or a convex shape with respect to the top surface of the high refractive layer, an interval of the grid patterns may be in a range of about 2 μm to about 5 μm, and a height or depth of the grid patterns may be in a range of about 5000 Å to about 10000 Å.

In embodiments, the display device may further include a low refractive layer disposed on the high refractive layer, the low refractive layer having a refractive index lower than the refractive index of the high refractive layer.

In embodiments, the display device may further include an adhesive layer disposed on the high refractive layer, and an optical layer disposed on the adhesive layer.

In embodiments, the thin film encapsulation layer may include a first inorganic layer, an organic layer disposed on the first inorganic layer, and a second inorganic layer disposed on the organic layer.

In embodiments, the display device may further include a first touch insulating layer disposed on the thin film encapsulation layer. The touch electrode may be disposed between the first touch insulating layer and the insulating pattern.

In embodiments, the touch electrode may include a first touch electrode layer, and a second touch electrode layer disposed on the first touch electrode layer. The display device may further include a second touch insulating layer disposed between the first touch electrode layer and the second touch electrode layer.

In embodiments, the insulating pattern may include an organic insulating material.

According to embodiments, a method of manufacturing a display device may include forming a pixel defining layer on a base substrate, the pixel defining layer including a first opening, forming a light emitting structure in the first opening of the pixel defining layer, forming a thin film encapsulation layer on the light emitting structure, forming a touch electrode on the thin film encapsulation layer, forming an insulating pattern on the thin film encapsulation layer on which the touch electrode is formed, the insulating pattern including a second opening that overlaps the first opening, forming a high refractive layer on the insulating pattern, the high refractive layer having a refractive index higher than a refractive index of the insulating pattern, and forming grid patterns on a top surface of the high refractive layer.

In embodiments, the forming of the grid patterns may include arranging the grid patterns on the top surface of the high refractive layer in a first direction at a constant interval and in a second direction perpendicular to the first direction at the constant interval.

In embodiments, the forming of the grid patterns may include forming a photoresist pattern on the high refractive layer, and etching the high refractive layer by using the photoresist pattern as an etching barrier.

In embodiments, the forming of the high refractive layer may include an inkjet process.

In embodiments, the forming of the grid patterns may include pressing a mold having a pattern corresponding to the grid pattern, on the high refractive layer, and transferring the pattern to the top surface of the high refractive layer.

In embodiments, the method may further include physically separating the mold from the top surface of the high refractive layer.

In embodiments, the method may further include removing the mold through a chemical scheme.

Therefore, a display device according to embodiments may include a touch electrode, which enables a touch input, and a high refractive layer having grid patterns, so that a deviation of a white angular difference (WAD) can be improved, and light output performance in a forward direction can be improved.

BRIEF DESCRIPTION OF THE DRAWINGS

FIG. 4 is a plan view showing a grid pattern of a high refractive layer of the display device of FIG. 3.

FIG. 6 is a schematic cross-sectional view showing a display device according to embodiments.

FIGS. 8A to 8C are schematic cross-sectional views for describing a method of manufacturing a display device according to embodiments.

DETAILED DESCRIPTION OF THE EMBODIMENTS

Figure 1:
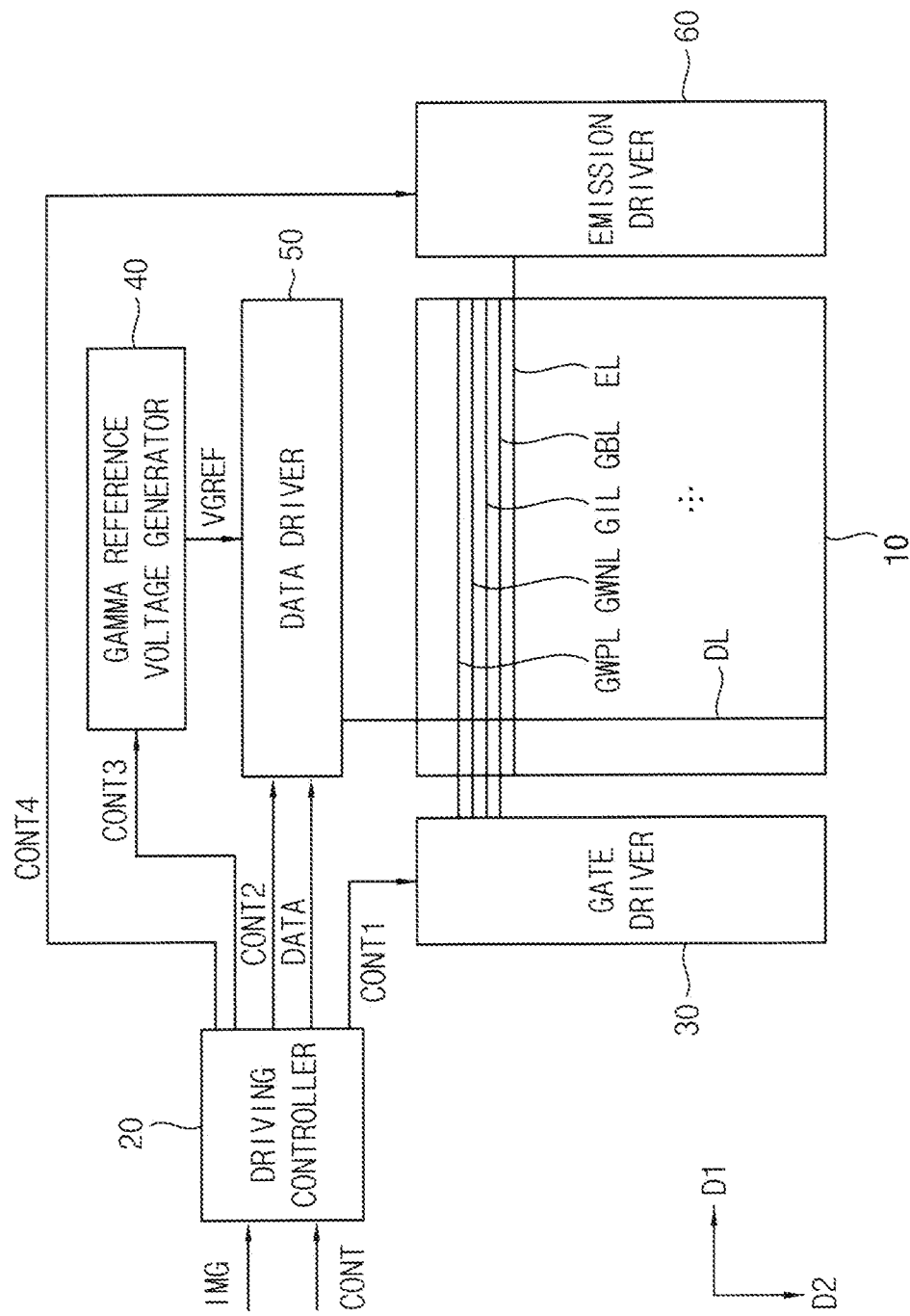
FIG. 1 is a block diagram illustrating a display device according to embodiments.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

The term "does not overlap" may include "apart from," "set aside from," or "offset from," and any other suitable equivalents as would be appreciated and understood by those of ordinary skill in the art.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

It will be further understood that the terms "comprises," "comprising," "includes," "including," "have," "having," "contains," and/or "containing" when used in this specification, are intended to specify the presence of stated features, regions, integers, steps, operations, elements, and/or components, but do not preclude the presence or addition of one or more other features, regions, integers, steps, operations, elements, components, and/or groups thereof.

Hereinafter, embodiments of the inventive concept will be explained in detail with reference to the accompanying drawings.

Figure 2:
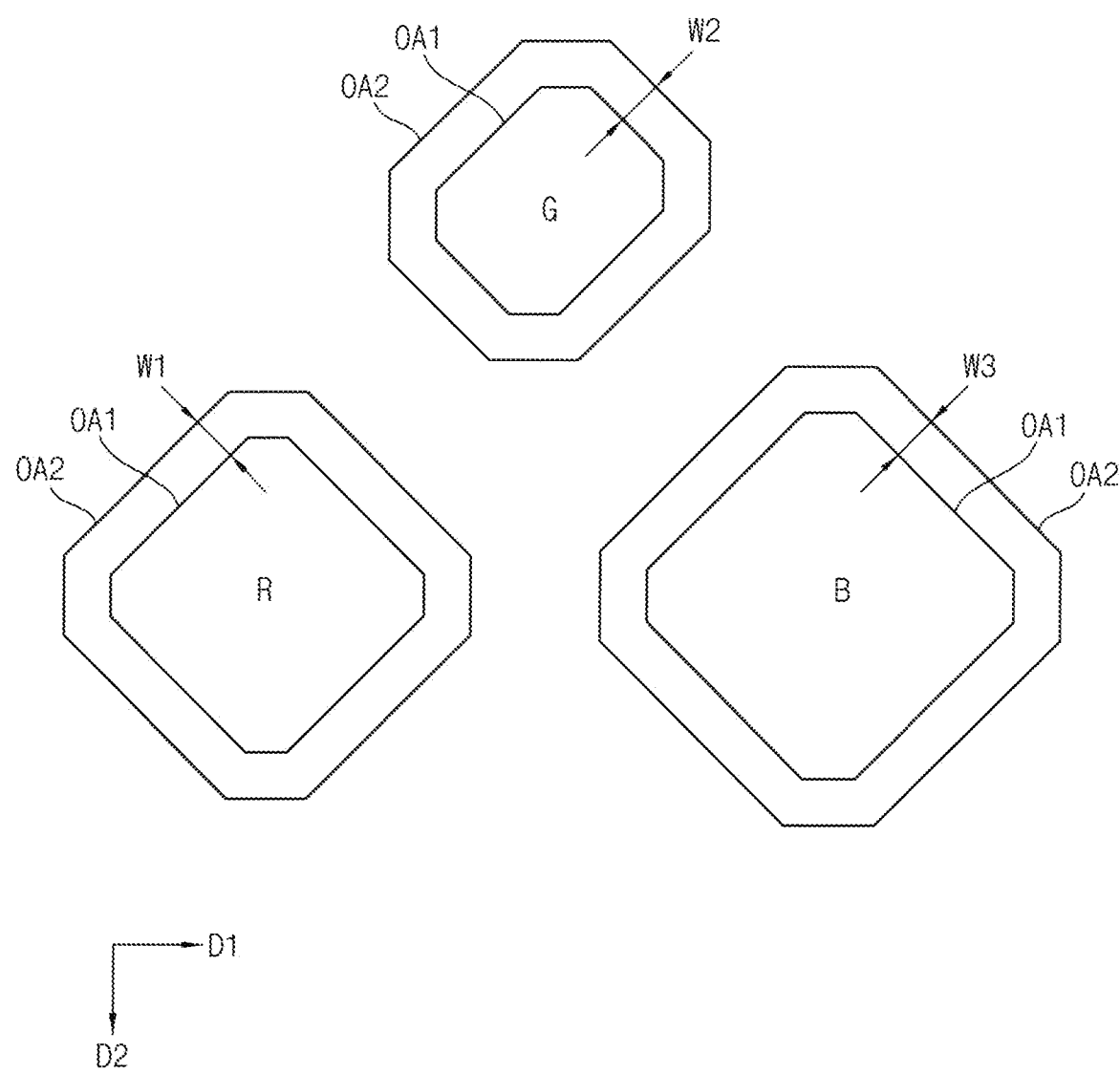
FIG. 2 is a plan view showing sub-pixels of the display device of FIG. 1.

FIG. 1 is a block diagram illustrating a display device according to embodiments, and FIG. 2 is a plan view showing sub-pixels of the display device of FIG. 1.

Referring to FIGS. 1 and 2, a display device may include a display panel 10 and a display panel driver. The display panel driver may include a driving controller 20, a gate driver 30, a gamma reference voltage generator 40, a data driver 50 and an emission driver 60.

The display panel 10 may include a display portion for displaying an image and a peripheral portion adjacent to the display portion.

The display panel 10 may include gate lines GWPL, GWNL, GIL, and GBL, data lines DL, emission lines EL, and pixels electrically connected to each of the gate lines GWPL, GWNL, GIL, and GBL, the data lines DL, and the emission lines EL. The gate lines GWPL, GWNL, GIL, and GBL may extend in a first direction D1, the data lines DL may extend in a second direction D2 intersecting the first direction D1, and the emission lines EL may extend in the first direction D1.

The driving controller 20 may receive input image data IMG and an input control signal CONT from an external device (not shown). For example, the input image data IMG may include red image data, green image data, and blue image data. The input control signal CONT may include a master clock signal and a data enable signal. The input control signal CONT may further include a vertical synchronization signal and a horizontal synchronization signal.

The driving controller 20 may generate a first control signal CONT1, a second control signal CONT2, a third control signal CONT3, a fourth control signal CONT4, and a data signal DATA based on the input image data IMG and the input control signal CONT.

The driving controller 20 may generate the first control signal CONT1 for controlling an operation of the gate driver 30 based on the input control signal CONT to output the first control signal CONT1 to the gate driver 30. The first control signal CONT1 may include a vertical start signal and a gate clock signal.

The driving controller 20 may generate the second control signal CONT2 for controlling an operation of the data driver 50 based on the input control signal CONT to output the second control signal CONT2 to the data driver 50. The second control signal CONT2 may include a horizontal start signal and a load signal.

The driving controller 20 may generate the data signal DATA based on the input image data IMG. The driving controller 20 may output the data signal DATA to the data driver 50.

The driving controller 20 may generate the third control signal CONT3 for controlling an operation of the gamma reference voltage generator 40 based on the input control signal CONT to output the third control signal CONT3 to the gamma reference voltage generator 40.

The driving controller 20 may generate the fourth control signal CONT4 for controlling an operation of the emission driver 60 based on the input control signal CONT to output the fourth control signal CONT4 to the emission driver 60.

The gate driver 30 may generate gate signals for driving the gate lines GWPL, GWNL, GIL, and GBL in response to the first control signal CONT1 received from the driving controller 20. The gate driver 30 may output the gate signals to the gate lines GWPL, GWNL, GIL, and GBL.

The gamma reference voltage generator 40 may generate a gamma reference voltage VGREF in response to the third control signal CONT3 received from the driving controller 20. The gamma reference voltage generator 40 may provide the gamma reference voltage VGREF to the data driver 50. The gamma reference voltage VGREF may have a value corresponding to each data signal DATA.

For example, the gamma reference voltage generator 40 may be disposed in the driving controller 20 or in the data driver 50.

The data driver 50 may receive the second control signal CONT2 and the data signal DATA from the driving controller 20, and may receive the gamma reference voltage VGREF from the gamma reference voltage generator 40. The data driver 50 may convert the data signal DATA into an analog data voltage by using the gamma reference voltage VGREF. The data driver 50 may output the data voltage to the data line DL.

The emission driver 60 may generate emission signals for driving the emission lines EL in response to the fourth control signal CONT4 received from the driving controller 20. The emission driver 60 may output the emission signals to the emission lines EL.

Each of the pixels of the display panel 10 may include a first sub-pixel R, a second sub-pixel G, and a third sub-pixel B. The first sub-pixel R may be a red sub-pixel, the second sub-pixel G may be a green sub-pixel, and the third sub-pixel B may be a blue sub-pixel. Each of the sub-pixels may include a thin film transistor (see TFT of FIG. 3) and a light emitting structure (see 180 of FIG. 3).

Figure 3:
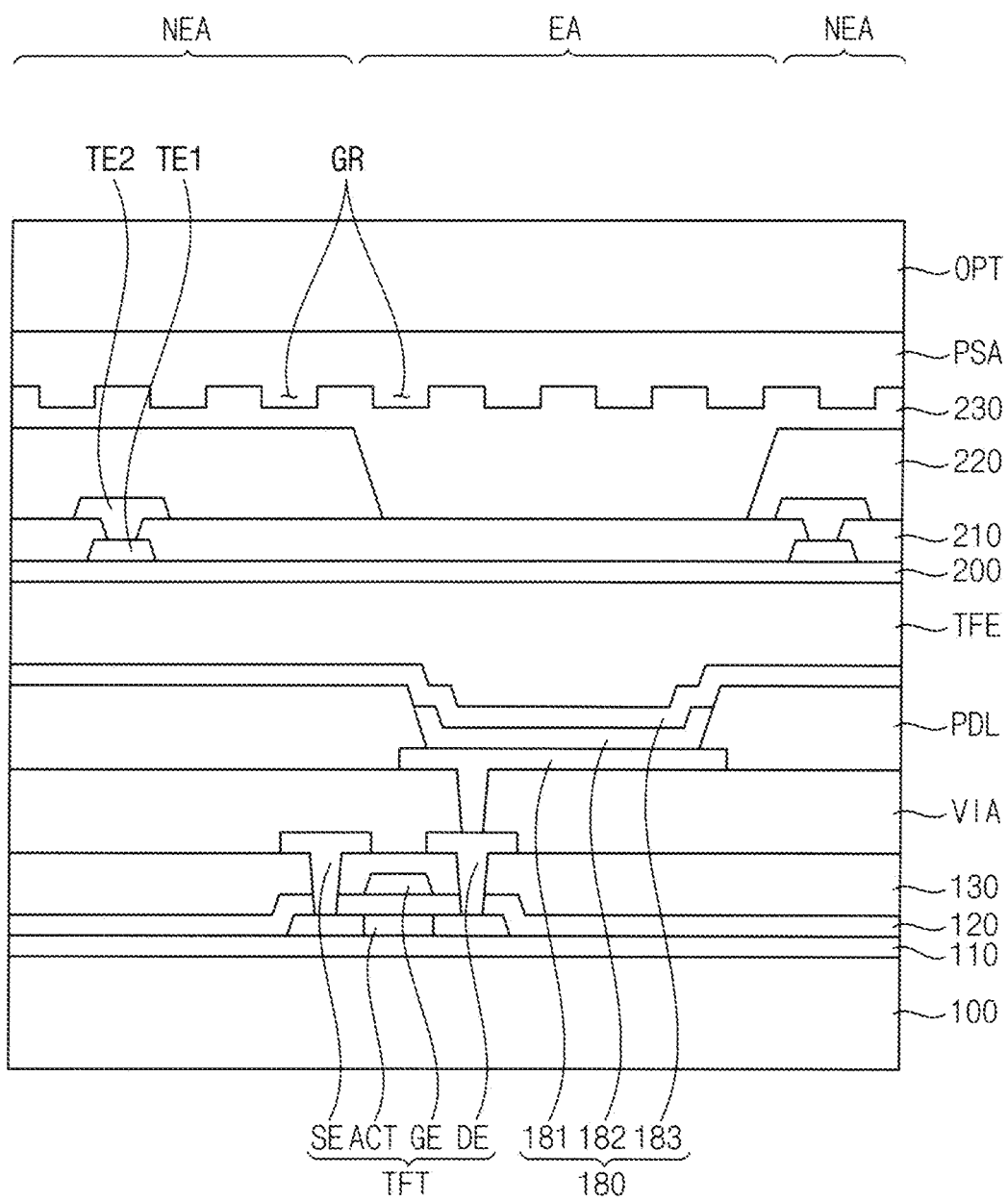
FIG. 3 is a schematic cross-sectional view showing the display device of FIG. 1.

Referring again to FIG. 2, in the first sub-pixel R, a first opening OA1 corresponding to an emission area may be defined by a pixel defining layer (see PDL of FIG. 3). A second opening OA2 which controls a direction of output light may be defined by an insulating pattern (see 220 of FIG. 3). The second opening OA2 may overlap the first opening OA1, and the second opening OA2 may be larger than the first opening OA1, so that the second opening OA2 may completely overlap the first opening OA1.

The second sub-pixel G and the third sub-pixel B may also have a structure similar to the first sub-pixel R, and shapes and sizes of the first sub-pixel R, the second sub-pixel G, and the third sub-pixel B may be different from each other as shown in the drawing.

A first interval W1 between the first opening OA1 and the second opening OA2 of the first sub-pixel R, a second interval W2 between the first opening OA1 and the second opening OA2 of the second sub-pixel G, a third interval W3 between the first opening OA1 and the second opening OA2 of the third sub-pixel B may be designed to be identical to or different from each other.

FIG. 3 is a schematic cross-sectional view showing the display device of FIG. 1, and FIG. 4 is a plan view showing a grid pattern of a high refractive layer of the display device of FIG. 3.

Referring to FIGS. 3 and 4, the display device may include a base substrate 100, a buffer layer 110, an active pattern ACT of a thin film transistor TFT, a first insulating layer 120, a gate conductive layer, a second insulating layer 130, a source-drain conductive layer, a via insulating layer VIA, a pixel defining layer PDL, a light emitting structure 180, a thin film encapsulation layer TFE, a first touch insulating layer 200, a first touch electrode layer TE1, a second touch insulating layer 210, a second touch electrode layer TE2, an insulating pattern 220, a high refractive layer 230, an adhesive layer PSA, and an optical layer OPT.

The base substrate 100 may be formed of a transparent or opaque material. For example, the base substrate 100 may include a quartz substrate, a synthetic quartz substrate, a calcium fluoride substrate, a fluorine-doped quartz substrate (F-doped quartz substrate), a soda lime glass substrate, a non-alkali glass substrate, and the like. In some embodiments, the base substrate 100 may be a transparent resin substrate having flexibility. Examples of the transparent resin substrate that may be used as the base substrate 100 include a polyimide substrate. The polyimide substrate may include a first polyimide layer, a barrier film layer, a second polyimide layer, and the like.

The buffer layer 110 may be disposed over the base substrate 100. The buffer layer 110 may prevent metal atoms or impurities from diffusing from the base substrate 100 into the active pattern ACT, and may control a heat transfer rate during a crystallization process for forming the active pattern ACT to obtain a substantially uniform active pattern ACT. When a surface of the base substrate 100 is not uniform, the buffer layer may serve to improve flatness of the surface of the base substrate 100.

The active pattern ACT of a thin film transistor TFT may be disposed on the buffer layer 110. The active pattern ACT may include poly crystal silicon or amorphous silicon. The active pattern ACT may include a drain region and a source region which are doped with impurities, and a channel region disposed between the drain region and the source region. In another embodiment, the active pattern ACT may include an oxide semiconductor.

The first insulating layer 120 may be disposed along a profile of the active pattern ACT with a substantially uniform thickness to cover the active pattern ACT on the buffer layer 110. The first insulating layer 120 may sufficiently cover the active pattern ACT on the buffer layer 110, and may have a substantially flat top surface without creating a step around the active pattern ACT. The first insulating layer 120 may include an inorganic insulating material such as a silicon compound and metal oxide.

The gate conductive layer may be disposed on the first insulating layer 120. The gate conductive layer may include a gate electrode GE of the thin film transistor TFT. The gate conductive layer may be formed by using a metal, an alloy, metal nitride, conductive metal oxide, a transparent conductive material, and the like.

The second insulating layer 130 may sufficiently cover the gate conductive layer on the first insulating layer 120, and may have a substantially flat top surface without creating a step around the gate conductive layer. The second insulating layer 130 may be disposed along a profile of the gate conductive layer with a substantially uniform thickness to cover the gate conductive layer on the first insulating layer 120. The second insulating layer 130 may include an inorganic insulating material such as a silicon compound and metal oxide.

The source-drain conductive layer may be disposed on the second insulating layer 130. The source-drain conductive layer may include a source electrode SE and a drain electrode DE of the thin film transistor TFT. The source-drain conductive layer may be formed by using a metal, an alloy, metal nitride, conductive metal oxide, a transparent conductive material, and the like.

The via insulating layer VIA may be disposed on the second insulating layer 130 on which the source-drain conductive layer is disposed. The via insulating layer VIA may have a single-layer structure, and may also have a multilayer structure including at least two insulating films. The via insulating layer VIA may be formed by using an organic material such as a photoresist, an acryl-based resin, a polyimide-based resin, a polyamide-based resin, and a siloxane-based resin.

The light emitting structure 180 may include a first electrode 181, a light emitting layer 182, and a second electrode 183.

The first electrode 181 may be disposed on the via insulating layer VIA. The first electrode 181 may be electrically connected to the thin film transistor TFT through a contact hole formed through the via insulating layer VIA. Depending on a light emitting scheme of the display device, the first electrode 181 may be formed by using a reflective material or a transmissive material. In embodiments, the first electrode 181 may have a single-layer structure or a multilayer structure including a metal film, an alloy film, a metal nitride film, a conductive metal oxide film, and/or a transparent conductive material film.

The pixel defining layer PDL may be disposed on the via insulating layer VIA on which the first electrode 181 is disposed. The pixel defining layer PDL may be formed by using an organic material, an inorganic material, and the like. For example, the pixel defining layer PDL may be formed by using a photoresist, a polyacryl-based resin, a polyimide-based resin, an acryl-based resin, a silicon compound, and the like. In the embodiments, the pixel defining layer PDL may be etched to form a first opening (see OA1 of FIGS. 2 and 7A) which partially exposes the first electrode 181. An emission area EA and a non-emission area NEA of the display device may be defined by the first opening of the pixel defining layer PDL. For example, a portion where the first opening of the pixel defining layer PDL is located may correspond to the emission area EA, and the non-emission area NEA may correspond to a portion adjacent to the first opening of the pixel defining layer PDL.

The light emitting layer 182 may be disposed on the first electrode 181 exposed through the first opening of the pixel defining layer PDL. The light emitting layer 182 may extend onto a side wall of the first opening of the pixel defining layer PDL. In the embodiments, the light emitting layer 182 may have a multilayer structure including an organic light emitting layer (EL), a hole injection layer (HIL), a hole transport layer (HTL), an electron transport layer (ETL), an electron injection layer (EIL), and the like. In another embodiment, except for the organic light emitting layer, the hole injection layer, the hole transport layer, the electron transport layer, the electron injection layer, and the like may be commonly formed to correspond to pixels. The organic light emitting layer of the light emitting layer 182 may be formed by using light emitting materials for generating different color lights such as red light, green light, and blue light according to each pixel of the display device. According to other embodiments, the organic light emitting layer of the light emitting layer 182 may have a structure in which light emitting materials for implementing different color lights such as red light, green light, and blue light are stacked to emit white light. The above light emitting structures may be commonly formed to correspond to the pixels, and the pixels may be classified by a color filter layer.

The second electrode 183 may be disposed on the pixel defining layer PDL and the light emitting layer 182. Depending on the light emitting scheme of the display device, the second electrode 183 may include a transmissive material or a reflective material. In the embodiments, the second electrode 183 may also have a single-layer structure or a multilayer structure including a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent moisture and oxygen from penetrating from an outside. The thin film encapsulation layer TFE may include at least one organic layer and at least one inorganic layer. The at least one organic layer and the at least one inorganic layer may be alternately stacked on each other. For example, the thin film encapsulation layer TFE may include a first inorganic layer, an organic layer disposed on the first inorganic layer, and a second inorganic layer disposed on the organic layer, but the embodiments are not limited thereto.

The first touch insulating layer 200 may be disposed on the thin film encapsulation layer TFE. The first touch insulating layer 200 may be formed by using an inorganic insulating material. For example, the first touch insulating layer 200 may be formed by using silicon nitride ($SiN_x$).

The first touch electrode layer TE1 may be disposed on the first touch insulating layer 200. The first touch electrode layer TE1 may be disposed in the non-emission area NEA. The first touch electrode layer TE1 may be formed by using a metal, an alloy, metal nitride, conductive metal oxide, a transparent conductive material, and the like. For example, the first touch electrode layer TE1 may include indium tin oxide (ITO).

The second touch insulating layer 210 may be disposed on the first touch insulating layer 200 on which the first touch electrode layer TE1 is disposed. The second touch insulating layer 210 may be formed by using an inorganic insulating material. For example, the second touch insulating layer 210 may be formed by using silicon nitride ($SiN_x$).

The second touch electrode layer TE2 may be disposed on the second touch insulating layer 210. The second touch electrode layer TE2 may be electrically connected to the first touch electrode layer TE1 through a contact hole formed through the second touch insulating layer 210. The second touch electrode layer TE2 may be formed by using a metal, an alloy, metal nitride, conductive metal oxide, a transparent conductive material, and the like. For example, the second touch electrode layer TE2 may include indium tin oxide (ITO).

The first touch electrode layer TE1 and the second touch electrode layer TE2 may constitute a touch electrode. The touch electrode may have a mesh structure when viewed in a plan view, but embodiments of the invention are not limited thereto. The touch electrode may have various shapes.

The insulating pattern 220 may be disposed on the second touch insulating layer 210 on which the second touch electrode layer TE2 is disposed. The insulating pattern 220 may define and include a second opening (see OA2 of FIGS. 2 and 7C) which overlaps the first opening. The insulating pattern 220 may have a refractive index smaller than a refractive index of the high refractive layer 230 which will be described below. For example, the insulating pattern 220 may have a refractive index of less than 1.6. The insulating pattern 220 may be formed of a polymer-based material. The polymer-based material may include one selected from the group consisting of an acryl-based resin, an epoxy-based resin, polyimide, and polyethylene.

The high refractive layer 230 may be disposed on the second touch insulating layer 210 on which the insulating pattern 220 is disposed. The high refractive layer 230 may have a refractive index higher than the refractive index of the insulating pattern 220. For example, the high refractive layer 230 may have a refractive index of about 1.6, and the insulating pattern 220 may have a refractive index of about 1.5.

Grid patterns GR may be formed on a top surface of the high refractive layer 230. The grid patterns GR may be arranged on the top surface of the high refractive layer 230 in the first direction D1 at a constant interval and the second direction D2 perpendicular to the first direction D1 at the constant interval. In the embodiments, the grid patterns GR may be a circular recess, an interval at which the grid patterns GR are arranged may be in a range of about 2 micrometers (μm) to about 5 μm, and a depth of the grid patterns GR may be in a range of about 5000 angstroms (Å) to about 10000 Å. For example, each of the grid patterns GR may be a cylindrical recess, the grid patterns GR may be arranged at an interval of about 3.8 μm, and each of the grid patterns GR may have a depth of about 7000 Å.

The adhesive layer PSA may be disposed on the high refractive layer 230. The adhesive layer PSA may include a pressure-sensitive adhesive.

The optical layer OPT may be disposed on the adhesive layer PSA. The optical layer OPT may be attached to the display device by the adhesive layer PSA. For example, the optical layer OPT may be a polarizing plate, a cover window, or the like.

According to the display device of the embodiment, light efficiency can be improved by the second opening of the insulating pattern 220 and the high refractive layer 230. Light emitted from the light emitting structure 180 may be refracted at an interface between the insulating pattern 220 and the high refractive layer 230, so that light output performance in a forward direction can be improved.

According to refraction in each of the first sub-pixel (see R of FIG. 2), the second sub-pixel (see G of FIG. 2), and the third sub-pixel (see B of FIG. 2), a white angular difference (WAD) may vary according to an azimuth angle. For example, a deviation of the WAD may be generated when the display device is viewed obliquely from a left or right side of the display device, and when the display device is viewed obliquely from an upper or lower side of the display device. The WAD refers to a factor for evaluating a variation of white light characteristics according to an observation angle with respect to the display device, and is an index for checking a degree of improvement of a wide viewing angle.

According to the embodiment, the light emitted from the light emitting structure 180 is scattered by the grid patterns GR of the high refractive layer 230, so that the deviation of the WAD due to the refraction at the interface between the insulating pattern 220 and the high refractive layer 230 can be reduced. A scattering level may be adjusted according to the interval and shapes of the grid patterns GR, and the interval and shapes of the grid patterns GR may be appropriately designed to improve the light output performance in the forward direction and the deviation of the WAD.

Figure 5:
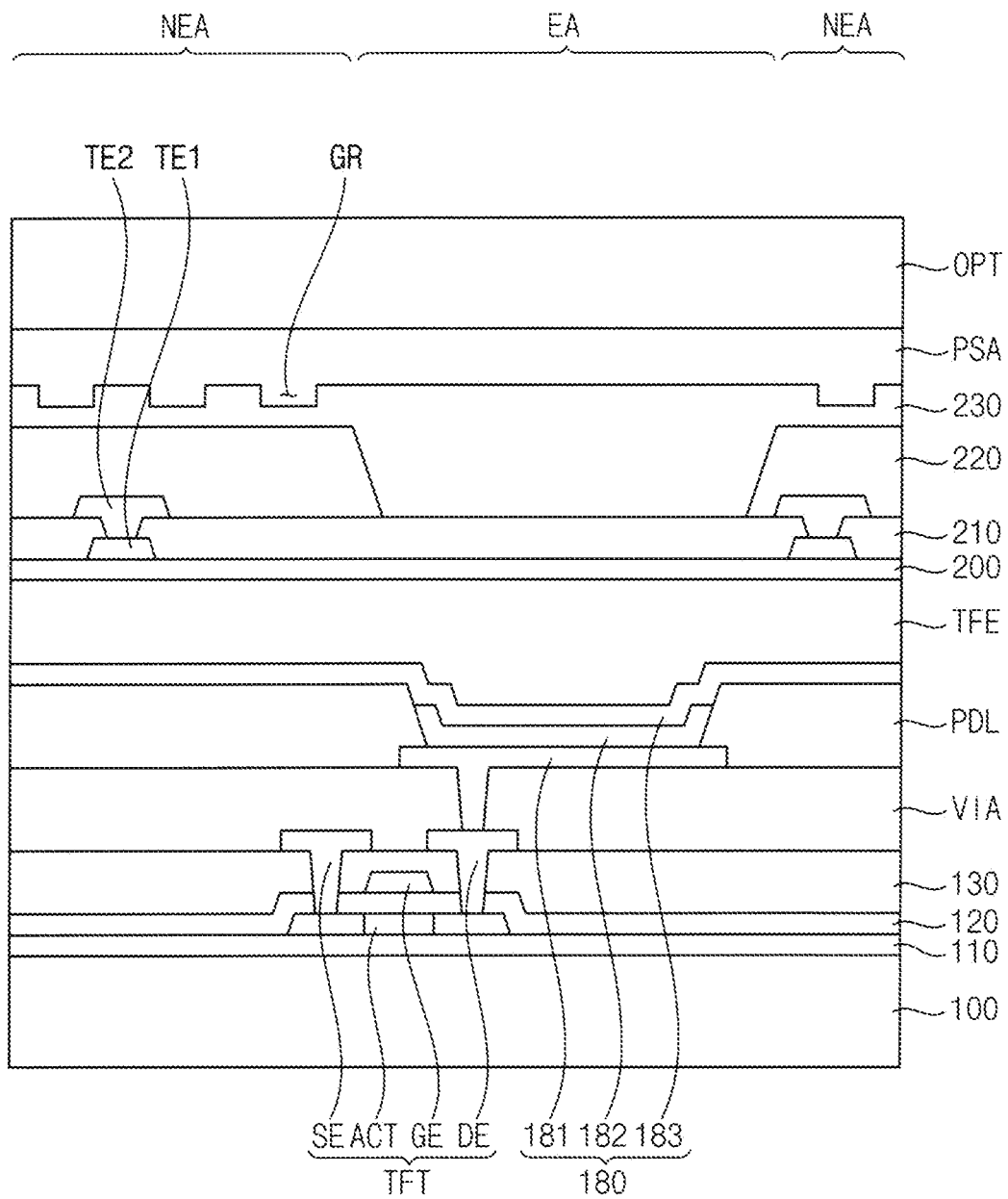
FIG. 5 is a schematic cross-sectional view showing a display device according to embodiments.

FIG. 5 is a schematic cross-sectional view showing a display device according to embodiments.

Referring to FIG. 5, a display device is substantially the same as the display device of FIGS. 1 to 4 except that the grid patterns GR are exclusively formed in a portion which does not overlap the second opening. Therefore, redundant descriptions thereof will be omitted.

The display device may include a base substrate 100, a buffer layer 110, an active pattern ACT of a thin film transistor TFT, a first insulating layer 120, a gate conductive layer, a second insulating layer 130, a source-drain conductive layer, a via insulating layer VIA, a pixel defined layer PDL, a light emitting structure 180, a thin film encapsulation layer TFE, a first touch insulating layer 200, a first touch electrode layer TE1, a second touch insulating layer 210, a second touch electrode layer TE2, an insulating pattern 220, a high refractive layer 230, an adhesive layer PSA, and an optical layer OPT.

The grid patterns GR of the high refractive layer 230 may be exclusively formed in the portion which does not overlap the second opening of the insulating pattern 220, in the non-emission area NEA. Accordingly, the light emitted from the light emitting structure 180 may be refracted at the interface between the insulating pattern 220 and the high refractive layer 230, so that the light output performance in the forward direction can be improved. Light obliquely output to an edge portion of the emission area EA may be scattered by the grid patterns GR, so that the deviation of the WAD due to the refraction at the interface between the insulating pattern 220 and the high refractive layer 230 can be reduced.

FIG. 6 is a schematic cross-sectional view showing a display device according to embodiments.

Referring to FIG. 6, a display device is substantially the same as the display device of FIGS. 1 to 4 except that the display device further includes a low refractive layer 240. Therefore, redundant descriptions thereof will be omitted.

The display device may include a base substrate 100, a buffer layer 110, an active pattern ACT of a thin film transistor TFT, a first insulating layer 120, a gate conductive layer, a second insulating layer 130, a source-drain conductive layer, a via insulating layer VIA, a pixel defined layer PDL, a light emitting structure 180, a thin film encapsulation layer TFE, a first touch insulating layer 200, a first touch electrode layer TE1, a second touch insulating layer 210, a second touch electrode layer TE2, an insulating pattern 220, a high refractive layer 230, a low refractive layer 240, an adhesive layer PSA, and an optical layer OPT.

The low refractive layer 240 may be disposed between the high refractive layer 230 and the adhesive layer PSA. The low refractive layer 240 may have a refractive index smaller than the refractive index of the high refractive layer 230. The refraction of light passing through the grid patterns GR of the high refractive layer 230 is affected by the refractive index of the high refractive layer 230 and the refractive index of the low refractive layer 240, so that a required difference between the refractive indexes may be easily designed by applying the low refractive layer 240. In other words, a degree of freedom in a design of the grid patterns GR of the high refractive layer 230 can be ensured by additionally providing the low refractive layer 240.

FIGS. 7A to 7F are schematic cross-sectional views for describing a method of manufacturing a display device according to embodiments.

Figure 7A:
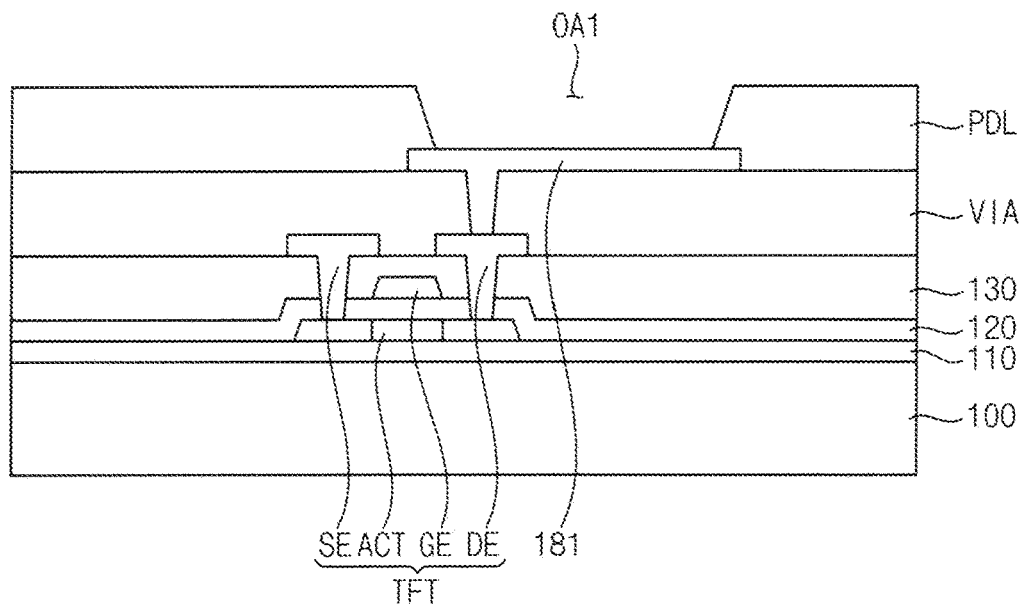
FIGS. 7A to 7F are schematic cross-sectional views for describing a method of manufacturing a display device according to embodiments.

Referring to FIG. 7A, the buffer layer 110 may be formed on the base substrate 100. The active pattern ACT of the thin film transistor TFT may be formed on the buffer layer 110. The first insulating layer 120 may be formed on the buffer layer 110 on which the active pattern ACT is formed. The gate conductive layer including the gate electrode GE of the thin film transistor TFT may be formed on the first insulating layer 120. The second insulating layer 130 may be formed on the first insulating layer 120 on which the gate electrode GE is formed. The source-drain conductive layer including the source electrode SE and the drain electrode DE of the thin film transistor TFT may be formed on the second insulating layer 130. The via insulating layer VIA may be formed on the second insulating layer 130 on which the source-drain conductive layer is formed. The first electrode 181 may be formed on the via insulating layer VIA. The pixel defining layer PDL including the first opening OA1 which exposes the first electrode 181 may be formed on the via insulating layer VIA on which the first electrode 181 is formed.

Figure 7B:
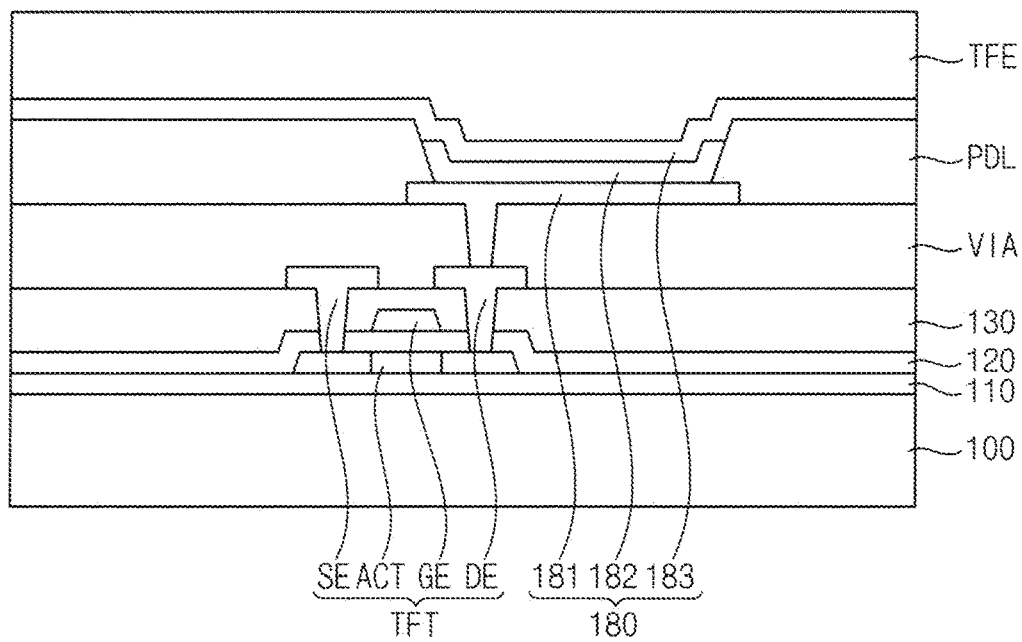

Referring to FIG. 7B, the light emitting layer 182 and the second electrode 183 may be sequentially formed on the first electrode 181. The thin film encapsulation layer TFE may be formed on the second electrode.

Figure 7C:
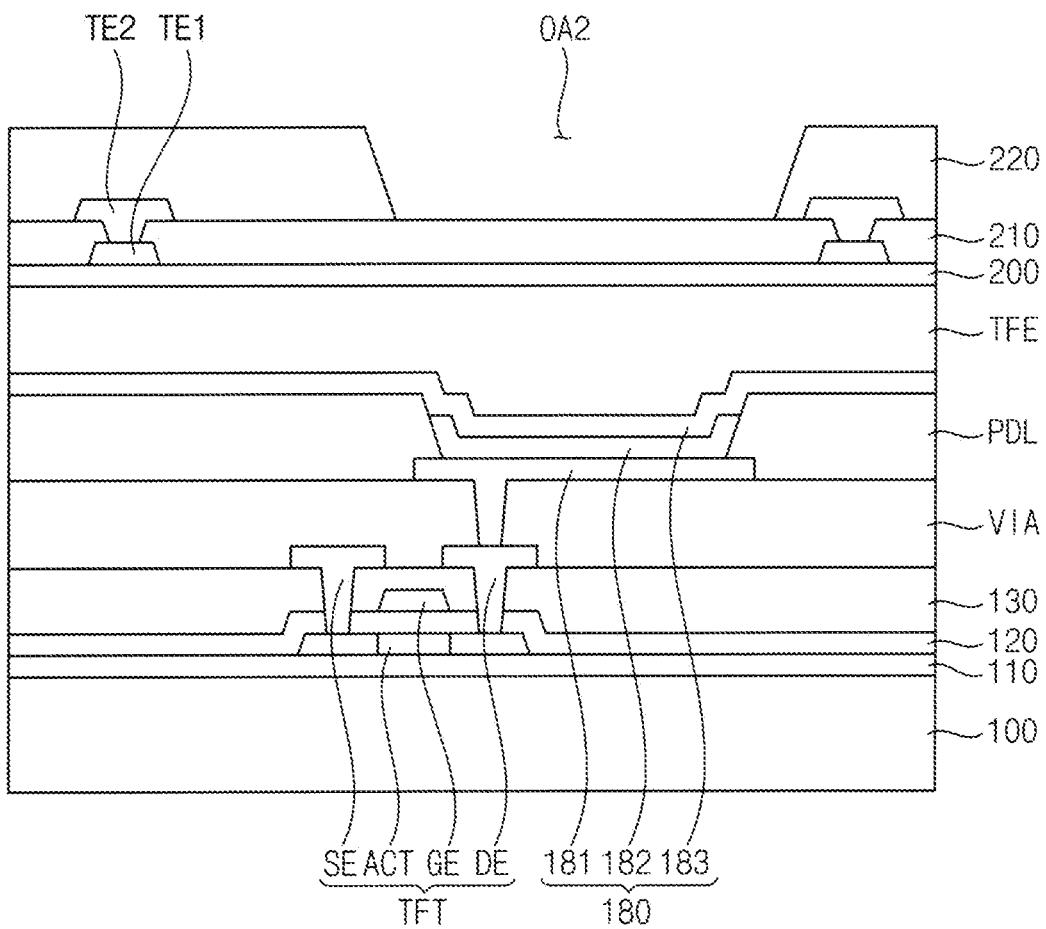

Referring to FIG. 7C, the first touch insulating layer 200 may be formed on the thin film encapsulation layer TFE. The first touch electrode layer TE1 may be formed on the first touch insulating layer 200. The second touch insulating layer 210 may be formed on the first touch insulating layer 200 on which the first touch electrode layer TE1 is formed. The second touch electrode layer TE2 may be formed on the first touch insulating layer 210.

The insulating pattern 220 including the second opening OA2 may be formed on the second touch insulating layer 210 on which the second touch electrode layer TE2 is formed.

Figure 7D:
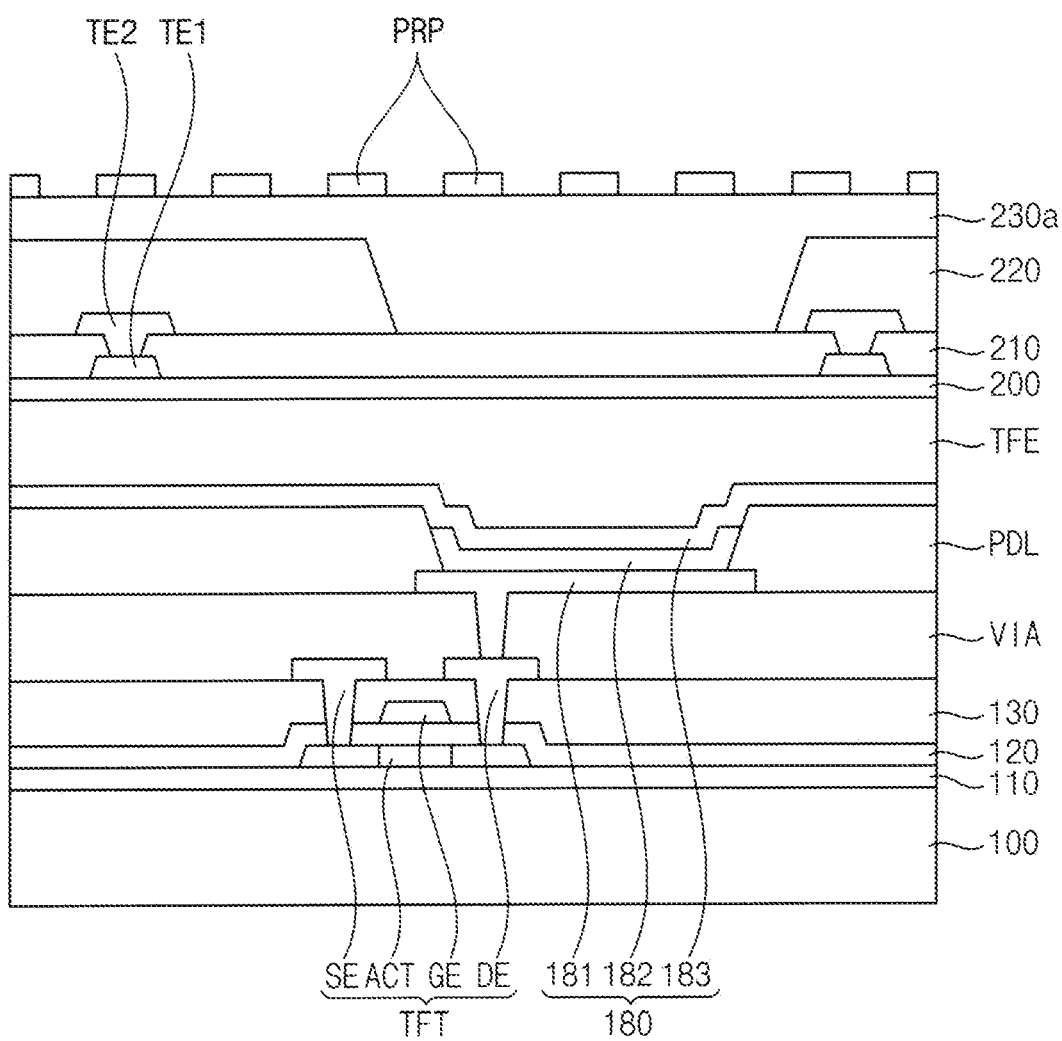

Referring to FIG. 7D, a high refractive layer 230a may be formed on the second touch insulating layer 210 on which the insulating pattern 220 is formed. A photoresist pattern PRP may be formed on the high refractive layer 230a.

Figure 7E:
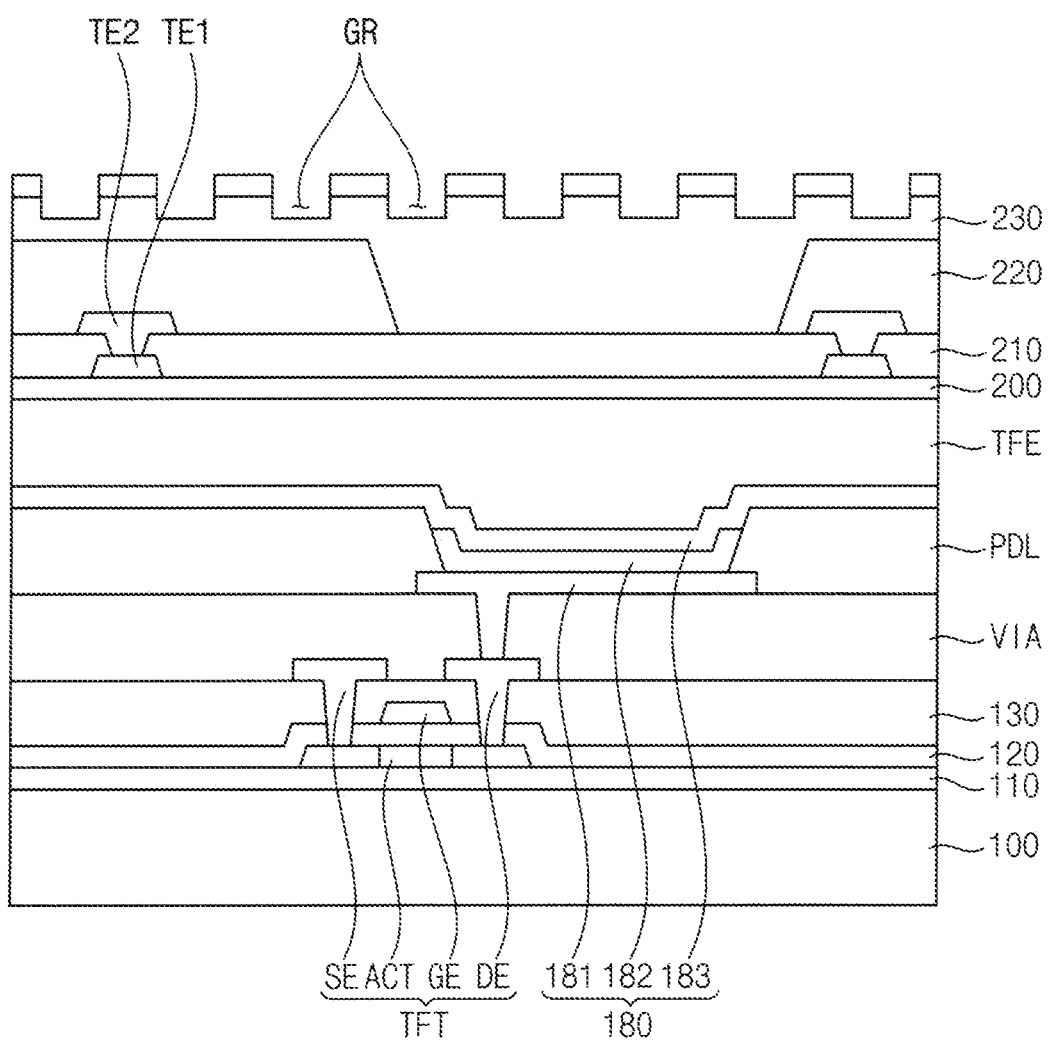

Referring to FIG. 7E, the grid patterns GR may be formed by etching the high refractive layer 230 by using the photoresist pattern PRP as an etching barrier.

Figure 7F:
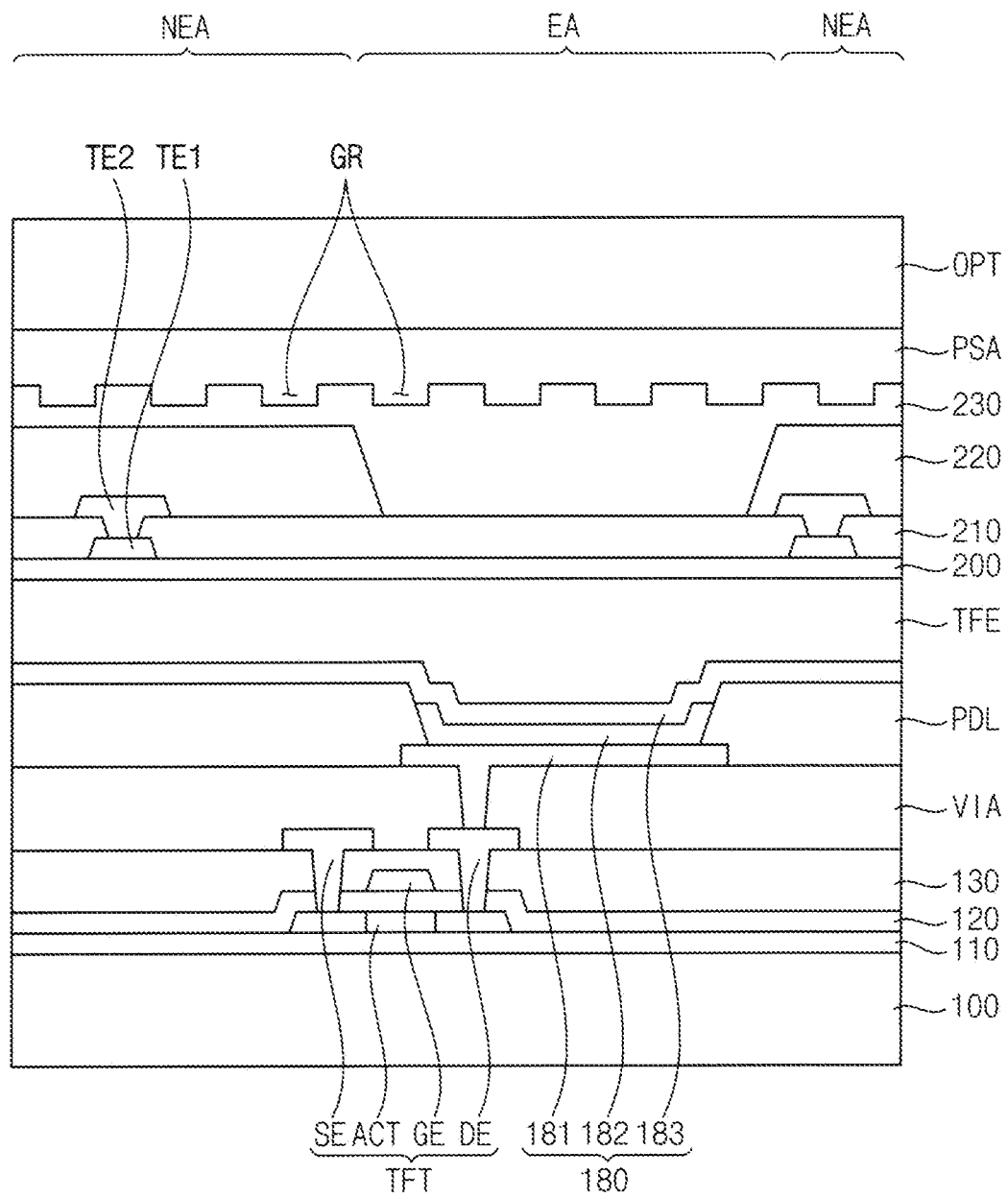

Referring to FIG. 7F, after the remaining photoresist pattern PRP is removed, the adhesive layer PSA and the optical layer OPT may be formed on the high refractive layer 230. For example, the optical layer OPT may be a polarizing plate, a cover window, or the like, and the optical layer OPT may be attached onto the high refractive layer 230 by using the adhesive layer PSA. Accordingly, the display device may be manufactured.

Figure 8A:
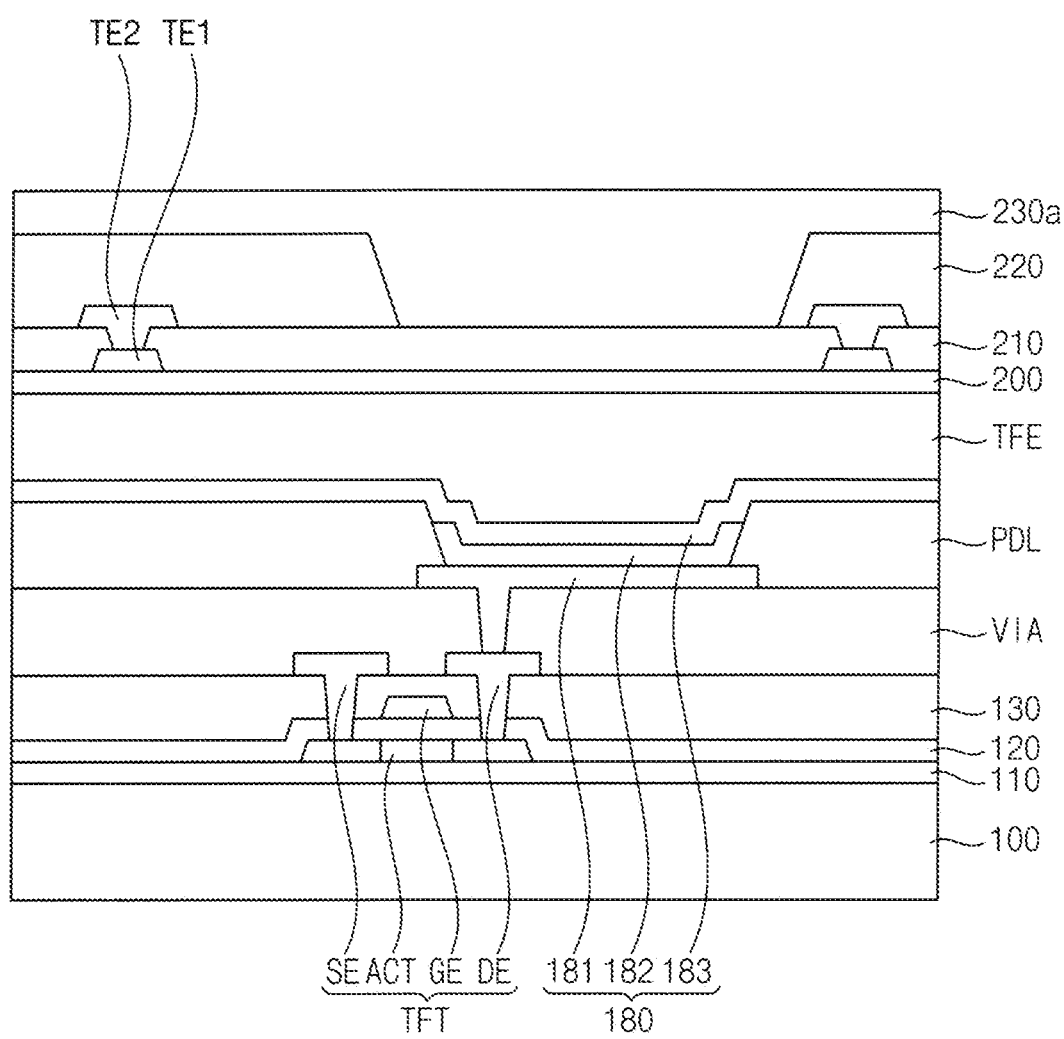
Figure 8B:
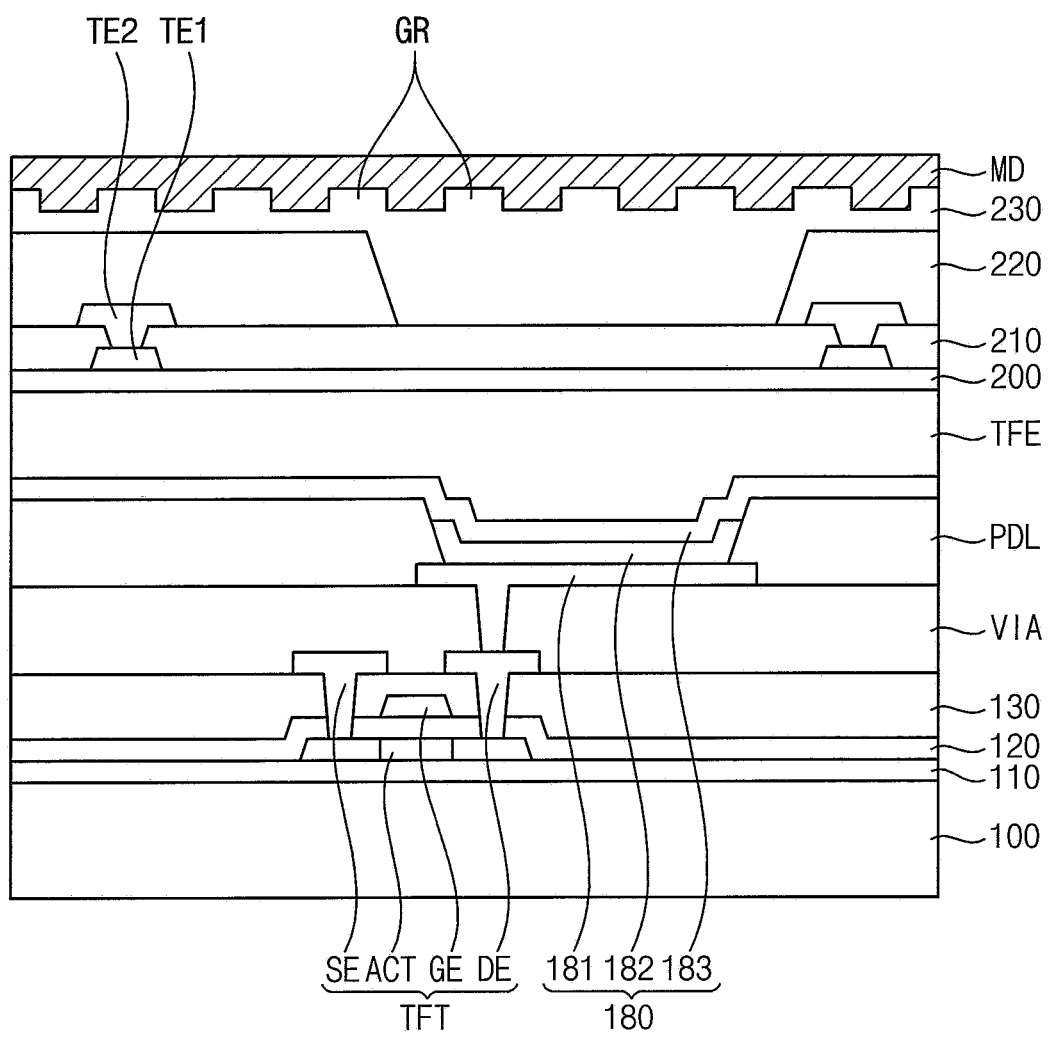

FIGS. 8A to 8C are schematic cross-sectional views for describing a method of manufacturing a display device according to embodiments.

Referring to FIG. 8A, the buffer layer 110 may be formed on the base substrate 100. The active pattern ACT of the thin film transistor TFT may be formed on the buffer layer 110. The first insulating layer 120 may be formed on the buffer layer 110 on which the active pattern ACT is formed. The gate conductive layer including the gate electrode GE of the thin film transistor TFT may be formed on the first insulating layer 120. The second insulating layer 130 may be formed on the first insulating layer 120 on which the gate electrode GE is formed. The source-drain conductive layer including the source electrode SE and the drain electrode DE of the thin film transistor TFT may be formed on the second insulating layer 130. The via insulating layer VIA may be formed on the second insulating layer 130 on which the source-drain conductive layer is formed. The first electrode 181 may be formed on the via insulating layer VIA. The pixel defining layer PDL including the first opening OA1 which exposes the first electrode 181 may be formed on the via insulating layer VIA on which the first electrode 181 is formed. The light emitting layer 182 and the second electrode 183 may be sequentially formed on the first electrode 181. The thin film encapsulation layer TFE may be formed on the second electrode 183. The first touch insulating layer 200 may be formed on the thin film encapsulation layer TFE. The first touch electrode layer TE1 may be formed on the first touch insulating layer 200. The second touch insulating layer 210 may be formed on the first touch insulating layer 200 on which the first touch electrode layer TE1 is formed. The second touch electrode layer TE2 may be formed on the first touch insulating layer 210.

The insulating pattern 220 including the second opening OA2 may be formed on the second touch insulating layer 210 on which the second touch electrode layer TE2 is formed.

The high refractive layer 230a may be formed on the second touch insulating layer 210 on which the insulating pattern 220 is formed. The high refractive layer 230a may be formed through an inkjet process. The high refractive layer 230a may include a photocurable material.

Referring to FIG. 8B, the grid patterns GR may be formed by pressing a mold MD, which has a pattern corresponding to the grid patterns GR, on the high-refractive layer 230a, and transferring the pattern to the top surface of the high refractive layer 230. The high refractive layer 230a may be an uncured layer having fluidity, and the grid patterns GR may be formed by pressing the mold MD. Thereafter, after the high refractive layer 230 is cured through a curing process such as photocuring, the mold MD may be removed.

The mold MD may be physically separated and removed from the top surface of the high refractive layer 230. According to another embodiment, the mold MD may be formed of a positive photoresist. As the photocuring of the high refractive layer 230 is performed, the mold MD may be dissolved and chemically removed by using a developer.

Referring to FIG. 8C, the adhesive layer PSA and the optical layer OPT may be formed on the high refractive layer 230 on which the grid patterns GR are formed. Accordingly, the display device may be manufactured.

Figure 9:
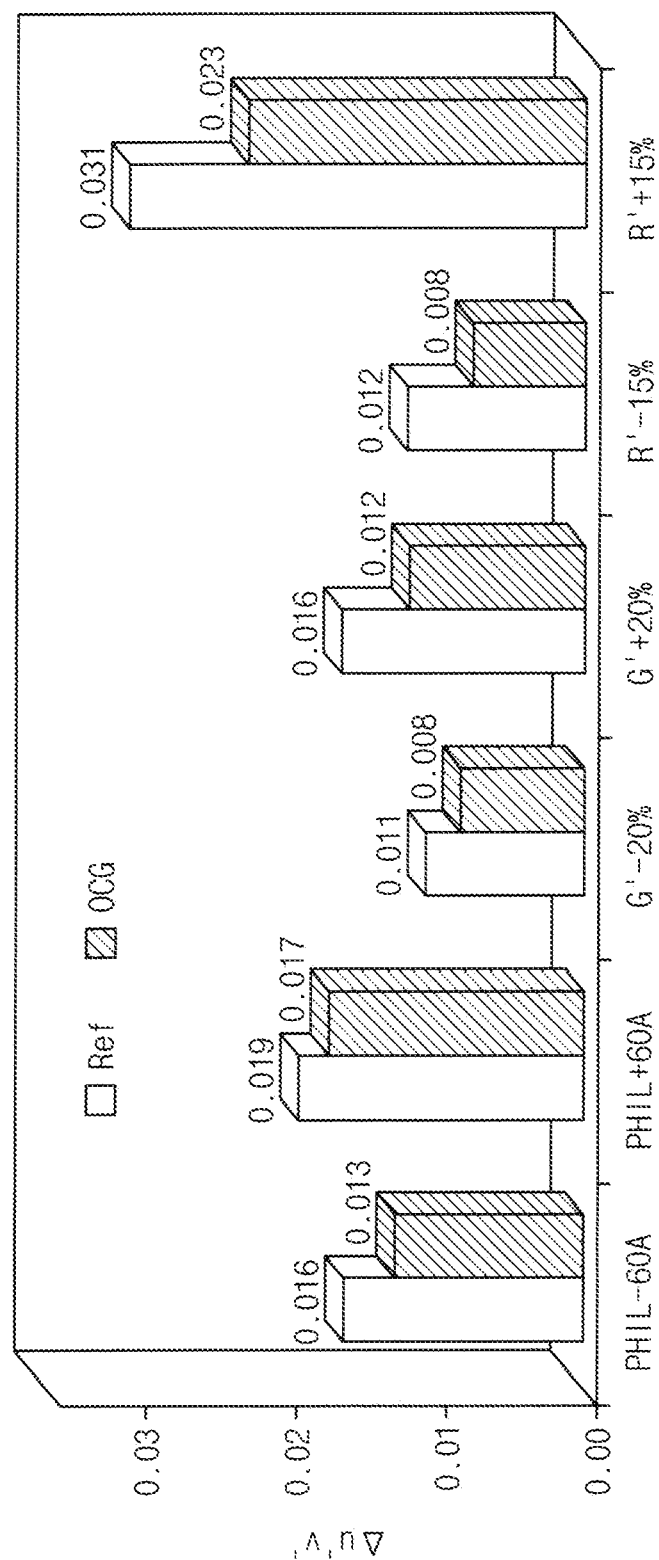
FIG. 9 is a graph illustrating a variation in WAD distributions according to whether a grid pattern is applied to a display device according to embodiments.

FIG. 9 is a graph illustrating a variation in WAD distributions according to whether grid patterns are applied to a display device according to embodiments.

Referring to FIG. 9, light emitting materials are shown on an x-axis of the graph, and calculated WAD distributions are shown on a y-axis of the graph. For each of the light emitting materials, the WAD distributions before applying the grid patterns (Ref) and after applying the grid patterns (OCG) according to an embodiment of the invention are shown in the drawing. It was found that the WAD distributions are reduced when the grid patterns are applied. The interval of the grid patterns was 3.8 and the depth of the grid patterns was 7000 Å.

Figure 10:
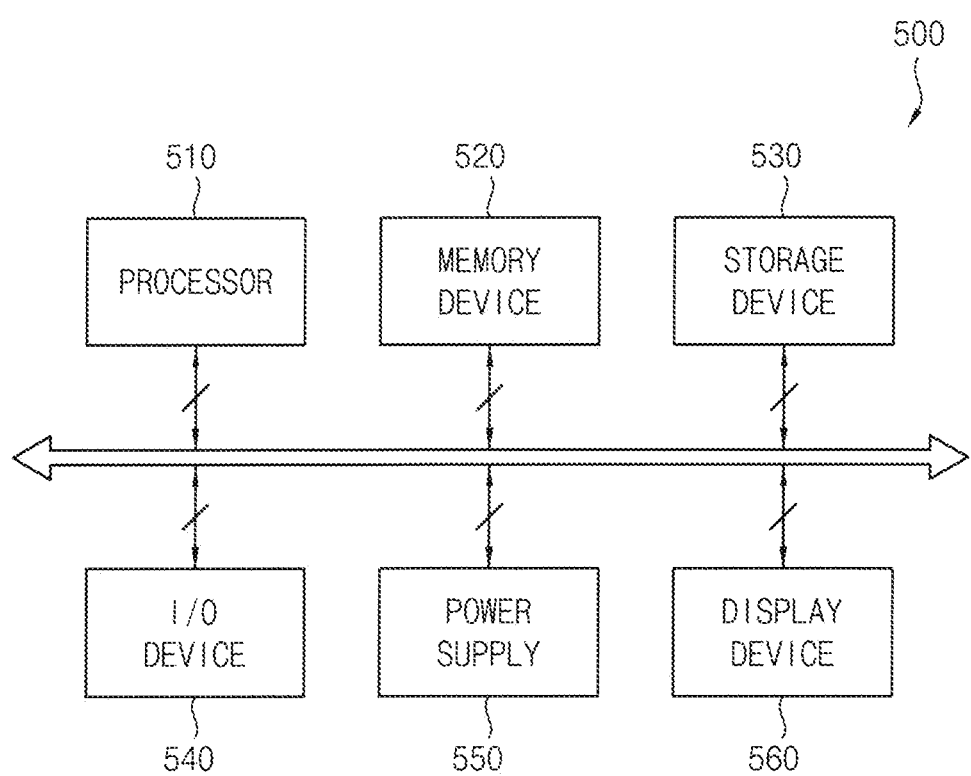
FIG. 10 is a block diagram illustrating an electronic device according to embodiments.
Figure 11A:
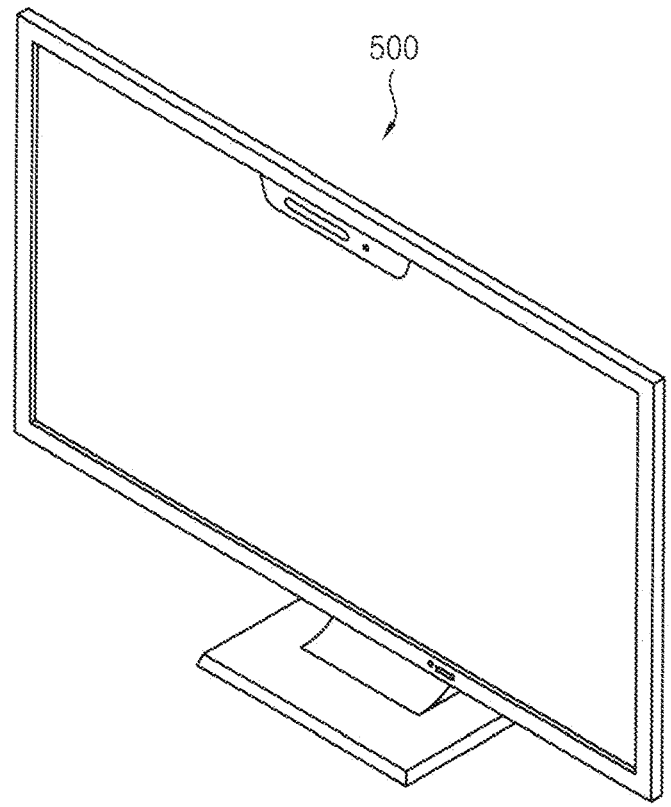
FIG. 11A is a diagram illustrating an example in which the electronic device of FIG. 10 is implemented as a television.
Figure 11B:
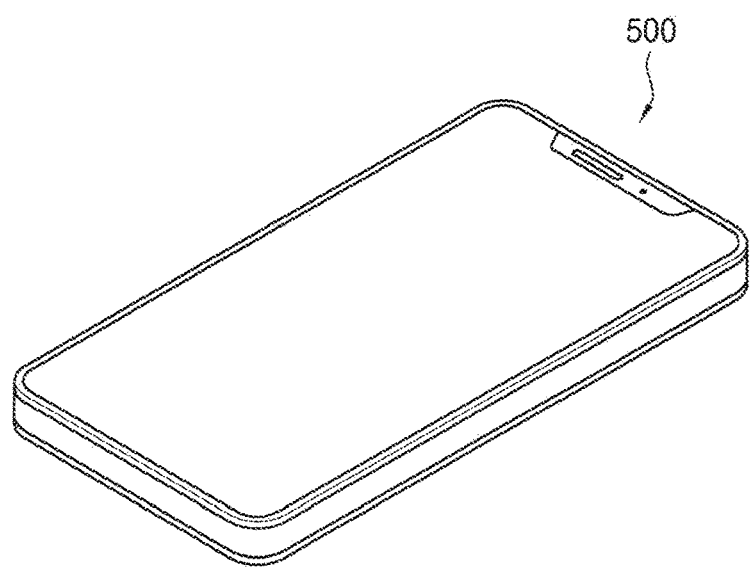
FIG. 11B is a diagram illustrating an example in which the electronic device of FIG. 10 is implemented as a smart phone.

FIG. 10 is a block diagram illustrating an electronic device according to embodiments, FIG. 11A is a diagram illustrating an example in which the electronic device of FIG. 10 is implemented as a television, and FIG. 11B is a diagram illustrating an example in which the electronic device of FIG. 10 is implemented as a smart phone.

Referring to FIGS. 10 to 11B, the electronic device 500 may include a processor 510, a memory device 520, a storage device 530, an input/output (I/O) device 540, a power supply 550, and a display device 560. Here, the display device 560 may be the display device of FIG. 1. The electronic device 500 may further include ports for communicating with a video card, a sound card, a memory card, a universal serial bus (USB) device, other electronic devices, etc. In an embodiment, as illustrated in FIG. 11A, the electronic device 500 may be implemented as a television. In another embodiment, as illustrated in FIG. 11B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) device, etc.

The processor 510 may perform various computing functions. The processor 510 may be a microprocessor, a central processing unit (CPU), an application processor (AP), etc. The processor 510 may be electrically coupled to other components via an address bus, a control bus, a data bus, etc. Further, the processor 510 may be electrically coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic device 500.

The display device 560 may be electrically coupled to other components via the buses or other communication links. In embodiments, the I/O device 540 may include the display device 560. As described above, the display device 560 may include a touch electrode, which enables a touch input, and a high refractive layer having grid patterns, so that the deviation of the WAD can be improved, and the light output performance in the forward direction can be improved. Since these are described above, duplicated description related thereto will not be repeated.

The inventive concept may be applied to a display device and an electronic device including the display device. For example, the inventive concept may be applied to a smart phone, a cellular phone, a video phone, a smart pad, a smart watch, a tablet PC, a car navigation system, a television, a computer monitor, a laptop, a head mounted display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a base substrate;
    a pixel defining layer disposed on the base substrate and including a first opening;
    a light emitting structure disposed in the first opening of the pixel defining layer;
    a thin film encapsulation layer disposed on the light emitting structure;
    a touch electrode disposed on the thin film encapsulation layer;
    an insulating pattern disposed on the touch electrode and including a second opening which overlaps the first opening; and
    a high refractive layer disposed on the insulating pattern, the high refractive layer including:
        a plurality of grid patterns disposed on a top surface of the high refractive layer, wherein the grid pattern is arranged such as to reduce deviation in white angular difference (WAD) in the display device; and a refractive index higher than a refractive index of the insulating pattern.

2. The display device of claim 1, wherein the second opening is larger than the first opening.

3. The display device of claim 2, wherein the plurality of grid patterns are disposed on the top surface of the high refractive layer in a first direction at a constant interval and in a second direction perpendicular to the first direction at the constant interval.

4. The display device of claim 3, wherein the plurality of grid patterns are each a circular recess or a circular protrusion.

5. The display device of claim 3, wherein the first opening includes:
a first opening of a first sub-pixel;
a first opening of a second sub-pixel; and
a first opening of a third sub-pixel, which each have mutually different sizes and shapes.

6. The display device of claim 1, wherein the plurality of grid patterns are exclusively disposed in a portion which does not overlap the second opening.

7. The display device of claim 1, wherein
the plurality of grid patterns have a concave shape or a convex shape with respect to the top surface of the high refractive layer,
an interval of the plurality of grid patterns is in a range of about 2 μm to about 5 μm, and
a height or depth of the plurality of grid patterns is in a range of about 5000 Å to about 10000 Å.

8. The display device of claim 1, further comprising:
a low refractive layer disposed on the high refractive layer, the low refractive layer having a refractive index lower than the refractive index of the high refractive layer.

9. The display device of claim 1, further comprising:
an adhesive layer disposed on the high refractive layer; and
an optical layer disposed on the adhesive layer.

10. The display device of claim 1, wherein the thin film encapsulation layer includes:
a first inorganic layer;
an organic layer disposed on the first inorganic layer; and
a second inorganic layer disposed on the organic layer.

11. The display device of claim 10, further comprising:
a first touch insulating layer disposed on the thin film encapsulation layer,
wherein the touch electrode is disposed between the first touch insulating layer and the insulating pattern.

12. The display device of claim 11, wherein
the touch electrode includes:
a first touch electrode layer; and
a second touch electrode layer disposed on the first touch electrode layer, and
the display device further comprises:
a second touch insulating layer disposed between the first touch electrode layer and the second touch electrode layer.

13. The display device of claim 1, wherein
the insulating pattern includes an organic insulating material.

14. The display device of claim 1, wherein the second opening is a through hole in the insulating pattern.

15. The display device of claim 1, wherein the high refractive layer is arranged within the second opening and fills the second opening.

* * * * *